United States Patent
Dahnke et al.

(10) Patent No.: US 7,471,085 B2
(45) Date of Patent: Dec. 30, 2008

(54) DETERMINATION OF RELAXATION RATE CHANGES FOR MR MOLECULAR IMAGING

(75) Inventors: Hannes Dahnke, Hamburg (DE); Tobias Schaffter, Blackheath (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 11/912,686

(22) PCT Filed: Apr. 13, 2006

(86) PCT No.: PCT/IB2006/051147

§ 371 (c)(1),
(2), (4) Date: Oct. 26, 2007

(87) PCT Pub. No.: WO2006/117704

PCT Pub. Date: Nov. 9, 2006

(65) Prior Publication Data

US 2008/0197843 A1    Aug. 21, 2008

(30) Foreign Application Priority Data

Apr. 29, 2005  (EP) .................. 05103548

(51) Int. Cl.
*G01V 3/00* (2006.01)
(52) U.S. Cl. ...................... 324/307; 324/309
(58) Field of Classification Search ......... 324/300–322; 600/407–422
See application file for complete search history.

(56) References Cited

U.S. PATENT DOCUMENTS

| | | | | |
|---|---|---|---|---|
| 5,545,990 A | * | 8/1996 | Kiefer et al. | 324/307 |
| 5,995,863 A | * | 11/1999 | Farace et al. | 600/410 |
| 2005/0134266 A1 | * | 6/2005 | Kabasawa | 324/309 |
| 2007/0080685 A1 | * | 4/2007 | Bydder et al. | 324/309 |
| 2007/0247153 A1 | * | 10/2007 | Yu et al. | 324/307 |

FOREIGN PATENT DOCUMENTS

DE  19923587 B4  11/2000

OTHER PUBLICATIONS

Hagberg, G. E., et al.; Real-Time Quantification of T2 Changes Using Multiecho Planar Imaging and Numerical Methods; 2002; Magnetic Resonance in Medicine; 48:877-882.

Jonsson, T., et al.; An image registration strategy for multi-echo fMRI; 1999; J. Magnetic Resonance Imaging; 10:154-158.

Posse, S., et al.; Enhancement of BOLD-contrast sensitivity by single-shot multi-echo functional MR imaging; 1999; Magnetic Resonance in Medicine; 42:87-97.

* cited by examiner

*Primary Examiner*—Brij B Shrivastav

(57) ABSTRACT

MR based molecular imaging is strongly supported by the accurate quantification of contrast agents. According to an exemplary embodiment of the present invention, a determination unit of an examination apparatus is adapted for determining an error propagation function, wherein the error propagation function is then used as a weighting function for an accurate determination Of $\Delta R_2^*$. This leads to an improved examination result.

13 Claims, 4 Drawing Sheets

DETERMINATION OF RELAXATION RATE CHANGES FOR MR MOLECULAR IMAGING

The present invention relates to the field of molecular imaging. In particular, the present invention relates to an examination apparatus for examination of an object of interest, to an image processing device, to a method of examining an object of interest, to a computer-readable medium and to a program element.

Magnetic resonance (MR) based molecular imaging is strongly supported by an accurate quantification of contrast agents. The monitoring of therapy effects like changing tumour vascularization and perfusion are of great importance in the clinical routine. Detecting a therapy effect requires an accurate and quantitative determination of contrast agent concentrations that induce changes in MR relaxation rates R2 and R2*. R2 is defined as the inverse of the T2 relaxation time (1/T2), also referred to as spin-spin transverse relaxation time. R2 is defined as the inverse of the T2* relaxation time, which includes T2 and additionally incorporates magnetic field inhomogeneities. Also, the detection of changing oxygen concentration, fMRI (functional Magnetic Resonance Imaging) applications, and T1 contrast agents benefit from an accurate quantification of changes in relaxation times or relaxation rates.

However, if the change in relaxation rate ($\Delta R2^*$) is not known a priori or if there is a wide range in the change of relaxation rate within the image, it may not be possible to accurately determining the change in relaxation rate on the basis of known techniques.

It is an object of the invention to have an improved determination of changes in relaxation rates.

According to the present invention, an examination apparatus for examination of an object of interest may be provided, the examination apparatus comprising an acquisition unit adapted for acquiring a first multi-echo dataset of the object of interest and a second multi-echo dataset of the object of interest, and a determination unit adapted for determining a weighting function, for determining a change in a relaxation time from corresponding echo times of the first and the second multi-echo dataset and for determining a weighted average of the change in relaxation time on the basis of the weighting function.

Therefore, the weighting function may be used for the calculation of a weighted average of $\Delta R2$ or $\Delta R2^*$. This leads to an optimized relaxation time change determination and therefore provides for an improved examination result.

According to an exemplary embodiment of the present invention, the determination of the weighting function is performed on the basis of an error function determination.

The use of an error propagation function may provide for an accurate determination of the weighted average of the change in relaxation time.

According to another exemplary embodiment of the present invention, the determination of the weighting function is performed on the basis of a signal difference between corresponding echoes from the first and the second multi-echo dataset, wherein the signal difference determines the weighting function value.

Thus, for example, a big signal difference may result in a corresponding big weighting function value and a small signal difference may result in a corresponding small weighting function value. This may provide for an effective weighting function determination.

According to another exemplary embodiment of the present invention, the first multi-echo dataset of the object of interest comprises a first echo at a first echo time and a second echo at a second echo time, and the second multi-echo dataset of the object of interest comprises a third echo at a third echo time and a fourth echo at a fourth echo time.

Therefore, according to this exemplary embodiment of the present invention, a relaxation time change $\Delta R2$ may be calculated for the first and the third echo time and for the second and the fourth echo time. This may result in multiple $\Delta R2^*$ values, which then may be averaged. For this average calculation, the error propagation function may be used as a weighting function.

According to another exemplary embodiment of the present invention, the first multi-echo dataset is acquired before an application of a contrast agent and the second multi-echo dataset is acquired after the application of the contrast agent.

Furthermore, according to another exemplary embodiment of the present invention, the weighting function is determined for a voxel of the object of interest.

Therefore, $\Delta R2^*$ may be calculated for every voxel by dividing the intensities of the voxel before and after contrast agent application and by calculating the logarithm of this fraction. If images before and after contrast agent application have been acquired at more than one echo time, this calculation may be performed for every echo time. This may always lead to a corresponding result of $\Delta R2^*$. Now, an average of these $\Delta R2^*$ values may be calculated on the basis of a weighting function.

According to another exemplary embodiment of the present invention, the error propagation function is the standard deviation of the change in a relaxation rate.

According to another exemplary embodiment of the present invention, the weighting function is calculated by using the relaxation times that are determined on the basis of an exponential fit to a change in intensity of the voxel with increasing echo time.

Therefore, according to this exemplary embodiment of the present invention, in order to calculate the weighting function, the relaxation times are determined by exponentially fitting intensity changes of the voxels with increasing echo time. This may yield the value for the relaxation time. This relaxation time may then be used for calculating the error propagation function in order to ensure that the intensity goes down to zero for high echo times.

According to another exemplary embodiment of the present invention, the examination apparatus may be applied as a baggage inspection apparatus, a medical application apparatus, a material testing apparatus or a material science analysis apparatus. A field of application of the invention may be material science analysis, since the defined functionality of the invention may allow for a secure, reliable and highly accurate analysis of a material.

According to another exemplary embodiment of the present invention, an image processing device for examination of an object of interest may be provided, the image processing device comprising a memory for storing a first multi-echo dataset of the object of interest and for storing a second multi-echo dataset of the object of interest. Furthermore, the image processing device may comprise a determination unit, adapted for determining a weighting function, for determining a change in a relaxation time from corresponding echo times of the first and the second multi-echo dataset and for determining a weighted average of the change in relaxation time on the basis of the weighting function.

Therefore, an image processing device may be provided which is adapted for performing an improved determination of changes in the relaxation rates, thus resulting in an accurate examination result.

According to another exemplary embodiment of the present invention, a method of examination of an object of interest is provided, the method comprising the steps of acquiring a first multi-echo dataset of the object of interest and a second multi-echo dataset of the object of interest, determining a weighting function, determining a change in a relaxation time from corresponding echo times of the first and the second multi-echo dataset, and determining a weighted average of the change in relaxation time on the basis of the weighting function.

According to another exemplary embodiment of the present invention, a computer-readable medium may be provided, in which a computer program of examination of an object of interest is stored which, when being executed by a processor, is adapted to carry out the above-mentioned method steps.

Furthermore, the present invention relates to a program element of examination of an object of interest, which may be stored on the computer-readable medium. The program element may be adapted to carry out the steps of acquiring a first multi-echo dataset of the object of interest and a second multi-echo dataset of the object of interest, determining a weighting function, determining a change in a relaxation time from corresponding echo times of the first and the second multi-echo dataset, and determining a weighted average of the change in relaxation time on the basis of the weighting function.

The program element may preferably be loaded into working memories of a data processor. The data processor may thus be equipped to carry out exemplary embodiments of the methods of the present invention. The computer program may be written in any suitable programming language, such as, for example, C++ and may be stored on a computer-readable medium, such as a CD-ROM. Also, the computer program may be available from a network, such as the WorldWideWeb, from which it may be downloaded into image processing units or processors, or any suitable computers.

It may be seen as the gist of an exemplary embodiment of the present invention that a quantitative determination of changes in relaxation rates before and after an application of contrast agent is provided. According to an exemplary embodiment of the present invention, a weighting function may be calculated on the basis of a multi-echo dataset acquired before and after the contrast agent application. The weighting function may then be used for weighting the multi-echo dataset in order to accurately determining $\Delta R2^*$.

These and other aspects of the present invention will become apparent from and elucidated with reference to the embodiment described hereinafter.

Exemplary embodiments of the present invention will be described in the following, with reference to the following drawings.

The illustration in the drawings is schematically. In different drawings, similar or identical elements may be provided with the same reference numerals.

Figure 1:
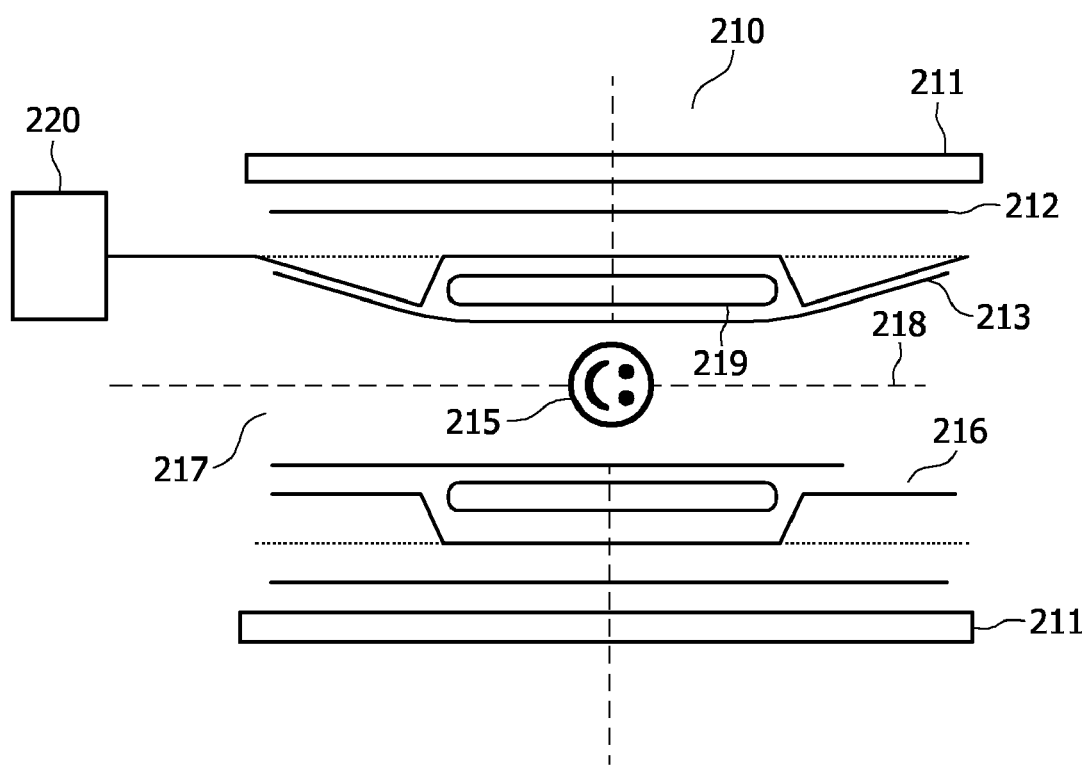
FIG. 1 shows a simplified schematic representation of an MR scanner according to an exemplary embodiment of the present invention.

FIG. 1 shows a simplified schematic representation of an embodiment of an MR scanner system according to the present invention. The MR scanner system comprises coils 210 which are arranged along an axis 218 and surround an examination space 217, in which a patient 215 which has to be examined is positioned. However, it should be noted, that the described examination apparatus may as well be used in the field of baggage inspection or material science analysis. Thus, the object of interest 215 may be an item of baggage or a material which has to be analyzed.

Advantageously, the object of interest 215 lies on a movable table or conveyor belt 216, which is disposed at the lower part of the examination space 217. The system of coils 210 surrounding the examination space 217 comprises an HF-coil 219, an actively shielded arrangement of gradient coils comprising an inner coil 213 and an actively shielded coil or shield 212 and a cryostat 211, in which the coils are arranged in order to be cooled down during generation of the magnetic field. The arrangement of gradient coils 213, 212 may be connected to a gradient amplifier 220 and to a determination unit (not depicted in FIG. 1) adapted for determining an error propagation function on the basis of a first dataset and a second dataset, acquired before an application of a contrast agent and after the application of the contrast agent, respectively.

Furthermore, the MR scanner system may comprise a motor control unit with respective motors (not depicted in FIG. 1), for example for moving the conveyor belt 216.

Figure 2:
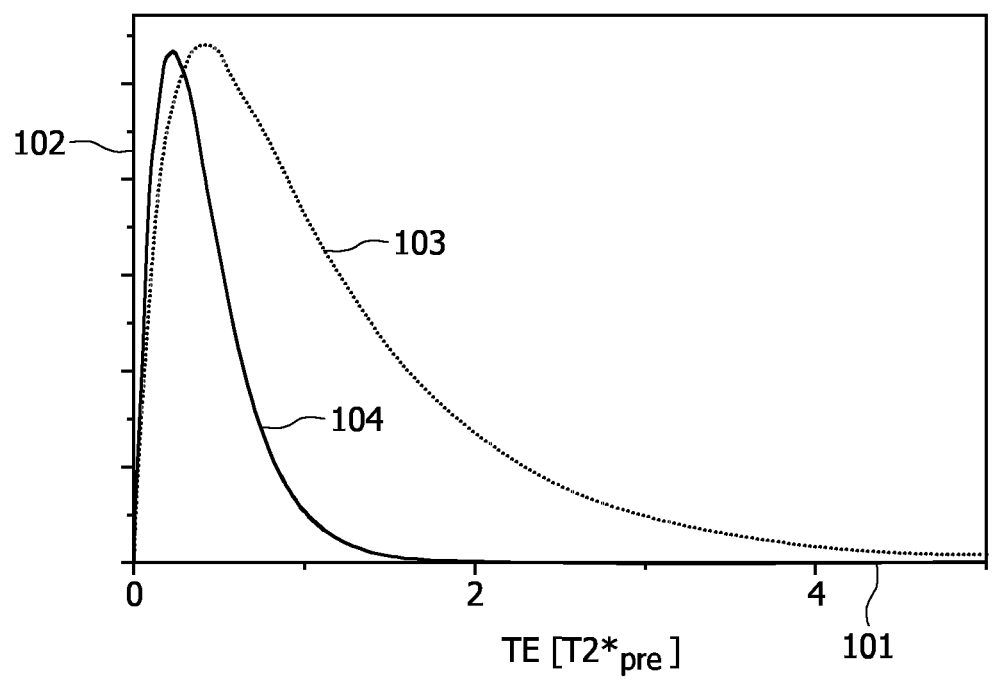
FIG. 2 shows a comparison of weighting functions on the basis of a simulation.

FIG. 2 shows a comparison of weighting functions with simulated data for one voxel plot 104 shows the inverse of standard deviation of $\Delta R_2^*$ plot 103 shows the contrast from signal difference before and after contrast agent application.

Changes in the relaxation rates $\Delta R_2^*$ may be determined by measuring two images at an echo time TE before and after contrast agent application. From this, the difference in the relaxation rate may be calculated. It should be noted, that, according to an exemplary embodiment of the present invention, the method may be applied for both R2 and R2*. However, $\Delta R_2^*$ may be given as $$\Delta R_2^* = -\frac{1}{TE}\ln\left(\frac{S_{post}(TE)}{S_{pre}(TE)}\right) \quad [1]$$

wherein $S_{post}$ and $S_{pre}$ are the signal intensities before and after the change in relaxation rate. The echo time may be chosen to be at the maximum contrast difference between $S_{post}$ and $S_{pre}$. This may be optimized, if the change in relaxation rate is known a priori and if there is not a wide range in $\Delta R_2^*$ within the image. By using a multi-echo sequence this may be optimized for every voxel. By measuring MR images at different echo times $TE_i$ an optimized method for the determination of $\Delta R_2^*$ may be provided, according to an exemplary embodiment of the present invention.

In order to minimize the noise of the $\Delta R_2^*$ determination, the error propagation function of equation (1) may be calculated for every voxel.

$$\delta(\Delta R_2^*(TE_i)) = \quad [2]$$

$$\sqrt{\left(\frac{1}{TE_i \cdot S_{pre}(TE_i)}\right)^2 \cdot \sigma(S_{pre})^2 + \left(\frac{1}{TE_i \cdot S_{post}(TE_i)}\right)^2 \cdot \sigma(S_{post})^2}$$

wherein $\delta(\Delta R_2^*(TE_i))$ is the standard deviation of $\Delta R_2^*$ and $\sigma(S_{pre})^2$, $\sigma(S_{post})^2$ are the variances of the noise in the images $S_{pre}$ and $S_{post}$. For the terms $S_{pre}(TE_i)$ and $S_{post}(TE_i)$ not the actual values of the pixel intensity may be used, since these values may not fall below the noise limit of the image and therefore the error propagation function may lead to wrong results. In order to gain a reliable estimate of the error propagation, these terms may be expressed by their theoretical values depending on their relaxation times:

$$S_{pre}(TE_i) = S_0 e^{\frac{-TE}{T_{2pre}^*}}. \quad [3a]$$

$$S_{post}(TE_i) = S_0 e^{\frac{-TE}{T_{2post}^*}}. \quad [3b]$$

The relaxation rates may need to be obtained from an exponential fit to the multi-echo dataset before and after contrast agent application.

$\Delta R_2^*$ may be calculated as mean of all measured echoes weighted with the standard deviation shown in equation (2). This standard deviation function of $\Delta R_2^*$ may show a different behaviour than the contrast function which is determined by $S_{post}(TE_i) - S_{pre}(TE_i)$, which may also be used as a weighting function as shown in FIG. 2, also the maximum of equation (2) and the maximum contrast may be at different $TE_i$ for large changes in $R_2^*$.

Axis 101 in FIG. 2 represents the different echo times $TE[T_{2\,pre}^*]$ and the vertical axis 102 represents the magnitude of the two weighting functions. Plot 103 shows the contrast from a signal difference before and after contrast agent application ($S_{pre} - S_{post}$) and plot 104 shows the inverse of the standard deviation of $\Delta R_2^*$, which is ($1/(\delta \Delta R_2^*)$).

According to an exemplary embodiment of the present invention, equation (2) is used as a weighting function for a multi-echo dataset in order to determine the most accurate $\Delta R_2^*$.

In images with a small signal-to-noise ratio, the noise may account a considerable fraction of the signal and the calculation of $\Delta R_2^*$ may need to be modified in order to obtain quantitatively accurate results. Therefore, according to an exemplary embodiment of the present invention, equation (1) may be completed by the mean noise:

$$\Delta R_2^* = -\frac{1}{TE} \ln\left(\frac{S_{post}(TE) + \text{mean\_noise}_{post}(TE)}{S_{pre}(TE) + \text{mean\_noise}_{pre}(TE))}\right) \quad [4]$$

The method may allow for an optimum determination of $\Delta R_2^*$ for every voxel. The approach may be independent of the range of $\Delta R_2^*$ within the image since it may be optimized for every voxel and may require no prior knowledge of the expected $\Delta R_2^*$.

Another approach for a multi-echo data according to an exemplary embodiment of the present invention may be the fitting of an exponential decay function to each of the measured datasets $S_{pre}(TE_i)$ and $S_{post}(TE_i)$ and calculating the difference $\Delta R_2^*$ from the fit result. This method may be prone to errors if the relaxation function deviates form a mono-exponential function as it does e.g. in the presence of large scale filed inhomogeneities. By using equation 1 these deviations may cancel in the fraction $S_{post}/S_{pre}$.

Figure 3:
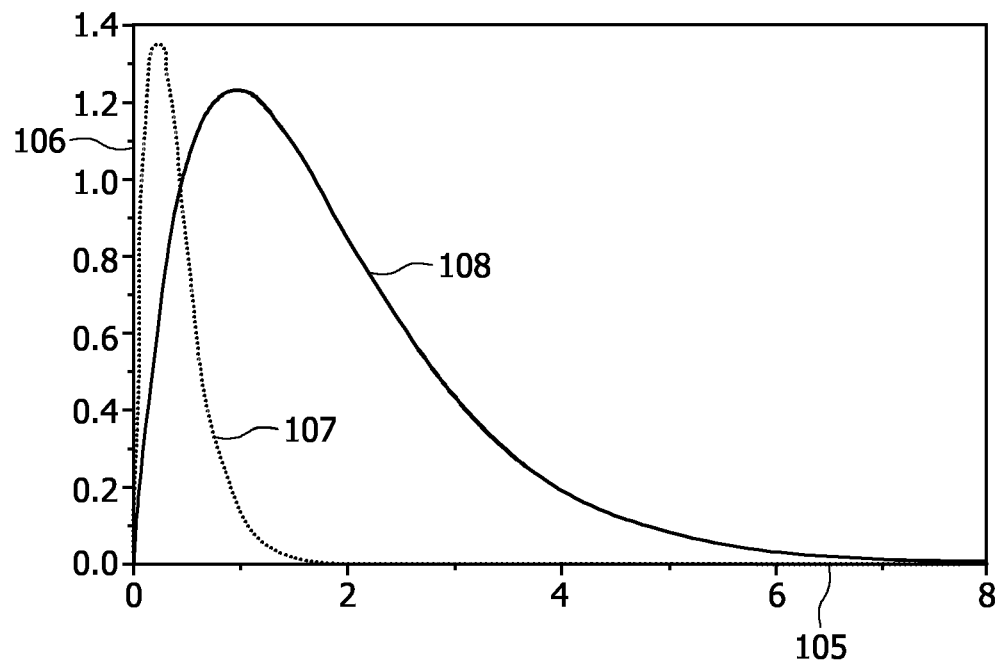
FIG. 3 shows exemplary examples of weighting functions of simulated data for two voxels with different decay times.

FIG. 3 shows two exemplary weighting functions of simulated data for two voxels with different decay times. Horizontal axis 105 represents the echo time $[T_2^*]$ and vertical axis 106 represents 1/(error of $\Delta R_2(TE)$) in arbitrary units. Plot 107 shows a weighting function for $\Delta R_2^*=0.8$ and plot 108 shows a weighting function for $\Delta R_2^*=0.1$. The signal-to-noise ratio of the voxels is about 5%.

Figure 4:
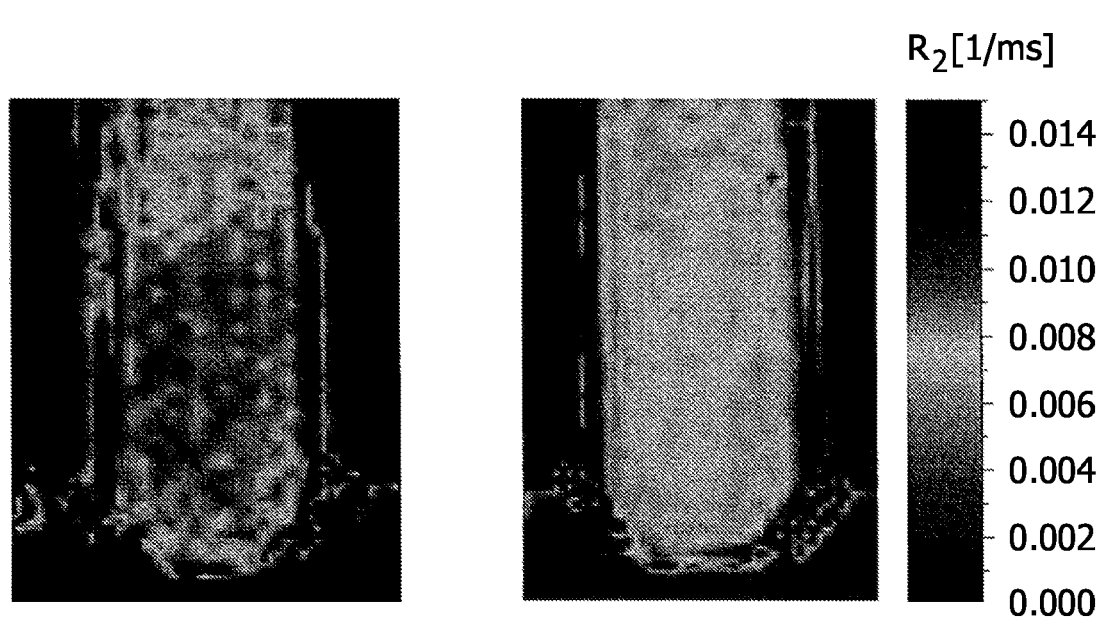
FIG. 4 shows exemplary examples of $\Delta R2^*$ parameter maps of a glass tube filled with a diluted iron oxide contrast agent.

FIG. 4 shows $\Delta R_2$ parameter maps of a glass tube filled with diluted iron oxide contrast agent. The left image shows a $\Delta R_2$-map with an accuracy of $\Delta R_2^*$ within the glass tube of 12% and the right image shows a $\Delta R_2$-map weighted calculation with an accuracy of $\Delta R_2^*$ within the glass tube of 7%, according to an exemplary embodiment of the present invention. The two images show a comparison of fitting an exponential decay to a relaxation function of multi-echo data before and after contrast agent application with the weighted calculation method for the same dataset. The grey scale is depicted in units [1/ms].

In other words, since the relaxation function may deviate from an exponential, for example due to field inhomogeneities, and therefore may falsify the $\Delta R_2^*$ determination, $\Delta R_2^*$ may be calculated from two weighted images measured at the same echo time TE.

According to an exemplary embodiment of the present invention, an optimal $\Delta R_2^*$ may be determined by calculating the mean noise of all measured images and generating relaxation time maps before and after contrast agent application. Then, the error of $\Delta R_2^*$ is calculated for every echo time. This may allow for a determination of the optimum echo time for the calculation of $\Delta R_2^*$ for every voxel.

Furthermore, according to an exemplary embodiment of the present invention, in a multi-echo experiment, all measured echoes may be utilized by calculating the weighted mean of all available echo times by using the error propagation function as weighting function. This may ensure an accurate determination of $\Delta R_2^*$ while concurrently using all available data.

The method according to an exemplary embodiment of the present invention may yield to robust and quantitatively accurate results for multi-echo datasets. Furthermore, the method may be independent of the range of $\Delta R_2^*$ within the image and may require no prior knowledge of the expected $\Delta R_2^*$. The application of the error propagation function may be an especially robust approach since it may incorporate the noise and the relaxation time maps. It may lead to quantitatively correct results, because all inhomogeneity effects may cancel out since only the difference $\Delta R_2^*$ is calculated. It may also be used for the determination of changes in oxygen concentration, for fMRI applications and for T1 contrast agents.

Figure 5:
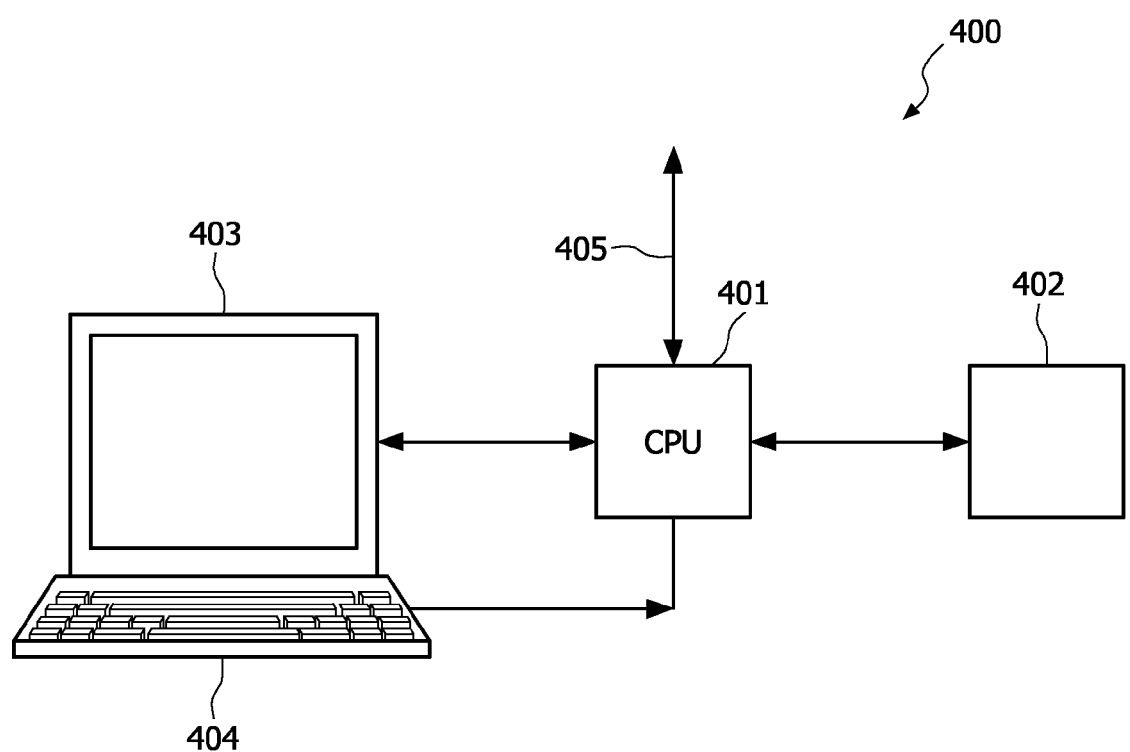
FIG. 5 shows an exemplary embodiment of an image processing device according to the present invention, for executing an exemplary embodiment of a method in accordance with the present invention.

FIG. 5 depicts an exemplary embodiment of an image processing device according to the present invention for executing an exemplary embodiment of the method in accordance with the present invention. The image processing device 400 depicted in FIG. 5 comprises a central processing unit (CPU) or image processor 401 connected to a memory 402 for storing an image depicting an object of interest, such as a patient or a material to be analyzed. The data processor 401 may be connected to a plurality of input/output network or diagnosis devices, such as an MR device. The data processor 401 may furthermore be connected to a display device 403, for example, a computer monitor, for displaying information or an image computed or adapted in the data processor 401. An operator or user may interact with the data processor 401 via a keyboard 404 and/or other output devices, which are not depicted in FIG. 5. Furthermore, via the bus system 405, it may also be possible to connect the image processing and control processor 401 to, for example, a motion monitor, which monitors a motion of the object of interest. In case, for example, a lung of a patient is imaged, the motion sensor may be an exhalation sensor. In case, the heart is imaged, the motion sensor function may be done by an electrocardiogram.

The examination of an object of interest according to the present invention may allow for a determination of an error propagation function on the basis of data measured before and after the application of a contrast agent. This may provide for an optimal data $R_2^*$ determination yielding to robust and quantitatively accurate results for multi-echo datasets.

Exemplary embodiments of the invention may be sold as a software option to MR scanner console workstations.

It should be noted that the term "comprising" does not exclude other elements or steps and the "a" or "an" does not exclude a plurality and that a single processor or system may fulfill the functions of several means or units recited in the claims. Also, elements described in association with different embodiments may be combined.

It should also be noted that any reference signs in the claims shall not be construed as limiting the scope of the claims.

We claim:

1. Magnetic resonance examination apparatus for examination of an object of interest, the magnetic resonance examination apparatus comprising:
    an acquisition unit adapted for acquiring a first multi-echo dataset of the object of interest and a second multi-echo dataset of the object of interest;
    a determination unit adapted for determining a weighting function, for determining a change in a relaxation time from corresponding echo times of the first and the second multi-echo dataset and for determining a weighted average of the change in relaxation time on the basis of the weighting function.

2. The examination apparatus of claim 1,
    wherein the determination of the weighting function is performed on the basis of an error function determination.

3. The examination apparatus of claim 1,
    wherein the determination of the weighting function is performed on the basis of a signal difference between corresponding echos from the first and the second multi-echo dataset; and
    wherein the signal difference determines the weighting function value.

4. The examination apparatus of claim 1,
    wherein the first multi-echo dataset of the object of interest comprises a first echo at a first echo time and a second echo at a second echo time; and
    wherein the second multi-echo dataset of the object of interest comprises a third echo at a third echo time and a fourth echo at a fourth echo time.

5. The examination apparatus of claim 1,
    wherein the first multi-echo dataset is acquired before an application of a contrast agent;
    wherein the second multi-echo dataset is acquired after the application of the contrast agent.

6. The examination apparatus of claim 1,
    wherein the weighting function is determined for a single voxel of the object of interest.

7. The examination apparatus of claim 1,
    wherein the error propagation function is the standard deviation of the change in a relaxation rate.

8. The examination apparatus of claim 1,
    wherein the weighting function is calculated by using the relaxation times that are determined on the basis of an exponential fit to a change in intensity of the voxel with increasing echo time.

9. The examination apparatus of claim 1, configured as one of the group consisting of a baggage inspection apparatus, a medical application apparatus, a material testing apparatus and a material science analysis apparatus.

10. An image processing device for examination of an object of interest, the image processing device comprising:
    a memory for storing a first multi-echo dataset of the object of interest and for storing a second multi-echo dataset of the object of interest;
    a determination unit, being adapted for determining a weighting function, for determining a change in a relaxation time from corresponding echo times of the first and the second multi-echo dataset and for determining a weighted average of the change in relaxation time on the basis of the weighting function.

11. A method of examination of an object of interest, method comprising the steps of:
    acquiring a first multi-echo dataset of the object of interest and a second multi-echo dataset of the object of interest;
    determining a weighting function;
    determining a change in a relaxation time from corresponding echo times of the first and the second multi-echo dataset; and
    determining a weighted average of the change in relaxation time on the basis of the weighting function.

12. A computer-readable medium, in which a computer program of examination of an object of interest is stored which, when being executed by a processor, is adapted to carry out the steps of:
    acquiring a first multi-echo dataset of the object of interest and a second multi-echo dataset of the object of interest;
    determining a weighting function;
    determining a change in a relaxation time from corresponding echo times of the first and the second multi-echo dataset; and
    determining a weighted average of the change in relaxation time on the basis of the weighting function.

13. A program element of examination of an object of interest, which, when being executed by a processor, is adapted to carry out the steps of:
    acquiring a first multi-echo dataset of the object of interest and a second multi-echo dataset of the object of interest;
    determining a weighting function;
    determining a change in a relaxation time from corresponding echo times of the first and the second multi-echo dataset; and
    determining a weighted average of the change in relaxation time on the basis of the weighting function.

* * * * *